(12) United States Patent
Lei et al.

(10) Patent No.: US 10,454,242 B1
(45) Date of Patent: Oct. 22, 2019

(54) 4-CHANNEL PARALLEL-OPTICAL DEVICE AND MONITORING METHOD THEREOF

(71) Applicant: O-NET COMMUNICATIONS (SHENZHEN) LIMITED, Shenzhen (CN)

(72) Inventors: Jiangqing Lei, Shenzhen (CN); Tengfei Zhu, Shenzhen (CN); Yanyong Wang, Shenzhen (CN)

(73) Assignee: O-NET COMMUNICATIONS (SHENZHEN) LIMITED, Shenzhen (CN)

(*) Notice: Subject to any disclaimer, the term of this patent is extended or adjusted under 35 U.S.C. 154(b) by 0 days.

(21) Appl. No.: 16/207,222

(22) Filed: Dec. 3, 2018

Related U.S. Application Data

(63) Continuation of application No. PCT/CN2018/101796, filed on Aug. 22, 2018.

(30) Foreign Application Priority Data

Mar. 30, 2018 (CN) .......................... 2018 1 0276406

(51) Int. Cl.
| | |
|---|---|
| *H01S 5/026* | (2006.01) |
| *G02B 5/08* | (2006.01) |
| *G02B 27/09* | (2006.01) |
| *G02B 27/30* | (2006.01) |
| *F21V 8/00* | (2006.01) |

(52) U.S. Cl.
CPC .............. *H01S 5/0267* (2013.01); *G02B 5/08* (2013.01); *G02B 6/0005* (2013.01); *G02B 27/0977* (2013.01); *G02B 27/30* (2013.01)

(58) Field of Classification Search
CPC ....... H01S 5/0267; G02B 5/08; G02B 6/0005; G02B 27/0977; G02B 27/30
USPC .......................................................... 398/38
See application file for complete search history.

(56) References Cited

U.S. PATENT DOCUMENTS

| | | | | |
|---|---|---|---|---|
| 9,529,164 | B1* | 12/2016 | Cheng ................. | G02B 6/4214 |
| 9,927,586 | B1* | 3/2018 | Mak ..................... | G02B 6/4286 |
| 2009/0323149 | A1* | 12/2009 | Mizukami ............ | G02B 6/2931 |
| | | | | 359/221.2 |
| 2010/0329669 | A1* | 12/2010 | Cunningham ......... | H04B 10/40 |
| | | | | 398/41 |
| 2015/0323420 | A1* | 11/2015 | Kuznia .............. | G01M 11/3145 |
| | | | | 356/73.1 |
| 2015/0378186 | A1* | 12/2015 | Xiong ..................... | G02F 1/093 |
| | | | | 359/484.04 |
| 2016/0365928 | A1* | 12/2016 | Xiao ....................... | H04B 10/40 |
| 2018/0120150 | A1* | 5/2018 | Cahill .................... | G01J 1/0271 |

* cited by examiner

*Primary Examiner* — Dalzid E Singh

(57) ABSTRACT

A 4-channel parallel-optical (SR4) device for monitoring an emission power includes an emission assembly for emitting laser, a receiving assembly for receiving the laser, and a monitoring assembly for monitoring the emission power of the emission assembly. The emission assembly includes an emission chip, a first inclined mirror for total reflecting the laser, and a second inclined mirror for refracting and reflecting the laser. The receiving assembly includes a third inclined mirror or total reflecting and focusing the laser. An inner angle of the first inclined mirror is matched with an inner angle of the second inclined mirror to horizontally transmit the laser towards the optical fiber.

18 Claims, 3 Drawing Sheets

US 10,454,242 B1

4-CHANNEL PARALLEL-OPTICAL DEVICE AND MONITORING METHOD THEREOF

CROSS-REFERENCE TO RELATED APPLICATIONS

This is a continuation-application of International Application No. PCT/CN2018/101796, with an international filing date of Aug. 22, 2018, which claims foreign priority to Chinese Patent Application No. 201810276406.0, filed on Mar. 30, 2018 in the State Intellectual Property Office of China, the contents of all of which are hereby incorporated by reference.

TECHNICAL FIELD

The present disclosure relates to the technical field of optical transceiver devices, and in particular to a 4-channel parallel-optical (SR4) device for monitoring an emission power and a monitoring method thereof.

BACKGROUND

At present, compared to concern spectrum efficiency and distance-bit rate product in long-distance network for people, in an inner network of large-throughput data center and optical fiber connected to a server that is only a few meters to several kilometers, people are more concerned with interconnection of stations with high-speed and short-distance optical fiber module.

However, a conventional 4-channel parallel-optical module for short reach optical links usually uses that four transceiver chips is integrated on a printed circuit board, a single-channel rate is 25 Gbps, namely total rate is up to 100 Gbps.

A 4-channel parallel-optical (SR4) device needs to monitor optical power of a transmitting terminal in use. An existing method is a splitting method that beam splitting prism directs signal of emission light source to a monitoring chip, which increases difficulty of device processing and surface coating process.

SUMMARY

The technical problem solved by the present disclosure is to provide a 4-channel parallel-optical (SR4) device for monitoring emission power and a monitoring method thereof capable of monitoring an emission power of emission chip.

In order to solve the technical problem mentioned above, the present disclosure provides a 4-channel parallel-optical (SR4) device for monitoring emission power, comprising: an emission assembly for emitting laser, a receiving assembly for receiving the laser, and a monitoring assembly for monitoring the emission power of the emission assembly. The emission assembly comprises an emission chip, a first inclined mirror for total reflecting the laser, and a second inclined mirror for refracting and reflecting the laser. The receiving assembly comprises a third inclined mirror for total reflecting and focusing the laser. An inner angle of the first inclined mirror is matched with an inner angle of the second inclined mirror to horizontally transmit the laser towards the optical fiber. The emission chip emits the laser to the first inclined mirror, the first inclined mirror total reflects the laser to the second inclined mirror, and the second inclined mirror refracts a part of the laser to the optical fiber and reflects a part of the laser to the monitoring assembly. The monitoring assembly receives the reflected laser and monitors power parameters of the reflected laser, the laser is emitted to the third inclined mirror through the optical fiber, the third inclined mirror total reflects the laser and focus the laser to the receiving chip, and the receiving chip receives the laser.

Furthermore, the first inclined mirror is a planar reflector, the third inclined mirror is a spherical reflector.

Furthermore, an angle between the first inclined mirror and the laser is 150°, and the laser is emitted to a surface of the first inclined mirror. An angle between the second inclined mirror and the laser is 150°, and the laser is emitted to a surface of the third inclined mirror. An angle between the third inclined mirror and the laser is 135°, and the laser is emitted to a surface of the third inclined mirror.

Furthermore, the emission assembly further comprises a first collimating lens for collimating the laser, where the first collimating lens is arranged adjacent to the emission chip. The emission chip emits the laser to the first collimating lens, and the laser is collimated by the first collimating lens and is transmitted to the first inclined mirror.

Furthermore, the emission assembly further comprises a first focusing lens for focusing the laser, where the first focusing lens is arranged adjacent to the optical fiber. The second inclined mirror refracts a part of the laser to the first focusing lens, and the laser is focused by the first focusing lens and is transmitted to the optical fiber.

Furthermore, the emission assembly further comprises a second focusing lens for focusing the laser, where the second focusing lens is arranged adjacent to the monitoring assembly. The second focusing lens reflects a part of the laser to the second focusing lens, and the laser is focused by the second focusing lens and is transmitted to the monitoring assembly.

Furthermore, the receiving assembly further comprises a second collimating lens for collimating the laser, where the second collimating lens is arranged adjacent to the optical fiber and the optical fiber transmits the laser to the second collimating lens. The laser is collimated by the second collimating lens and is transmitted to the third inclined mirror.

Furthermore, the receiving assembly further comprises a third focusing lens for focusing the laser, where the third focusing lens is arranged between the third inclined mirror and the receiving chip; the third inclined mirror total reflects the laser and focuses the laser on the third focusing lens, and the laser is focused by the third focusing lens and is transmitted to the receiving chip.

Furthermore, the receiving assembly further comprises a third collimating lens for collimating the laser, where the third collimating lens is arranged between the third focusing lens and the receiving chip. The laser is focused by the third collimating lens and is transmitted to the third collimating lens, and the laser is collimated by the third collimating lens and is transmitted to the receiving chip.

The present disclosure further provides a monitoring method for above 4-channel parallel-optical (SR4) device, the SR4 comprises an emission assembly for emitting laser, a receiving assembly for receiving the laser, and a monitoring assembly for monitoring the emission power of the emission assembly; the emission assembly comprises an emission chip, a first inclined mirror for total reflecting the laser, and a second inclined mirror for refracting and reflecting the laser; the receiving assembly comprises a third inclined mirror for total reflecting and focusing the laser; an inner angle of the first inclined mirror is matched with an inner angle of the second inclined mirror to horizontally transmit the laser towards the optical fiber the monitoring method comprises:

emitting laser, by an emission chip, to a first inclined mirror;

total reflecting the laser, by the first inclined mirror, to the second inclined mirror;

refracting a part of the laser, by the second inclined mirror, to the optical fiber, and reflecting a part of the laser to the monitoring assembly:

emitting the laser to the third inclined mirror through the optical fiber;

receiving the reflected laser and monitors power parameters of the reflected laser by the monitoring assembly;

total reflecting the laser, by the third inclined mirror, and focusing the laser to the receiving chip; and receiving the laser by the receiving chip.

Furthermore, the first inclined mirror is a planar reflector, the third inclined mirror is a spherical reflector.

Furthermore, an angle between the first inclined mirror and the laser is 150°, and the laser is emitted to a surface of the first inclined mirror. An angle between the second inclined mirror and the laser is 150°, and the laser is emitted to a surface of the third inclined mirror. An angle between the third inclined mirror and the laser is 135°, and the laser is emitted to a surface of the third inclined mirror.

Furthermore, the emission assembly further comprises a first collimating lens for collimating the laser, where the first collimating lens is arranged adjacent to the emission chip. The emission chip emits the laser to the first collimating lens, and the laser is collimated by the first collimating lens and is transmitted to the first inclined mirror.

Furthermore, the receiving assembly further comprises a first focusing lens for focusing the laser, where the first focusing lens is arranged adjacent to the optical fiber. The second inclined mirror refracts a part of the laser to the first focusing lens, and the laser is focused by the first focusing lens and is transmitted to the optical fiber.

Furthermore, the emission assembly further comprises a second focusing lens for focusing the laser, where the second focusing lens is arranged adjacent to the monitoring assembly. The second focusing lens reflects a part of the laser to the second focusing lens, and the laser is focused by the second focusing lens and is transmitted to the monitoring assembly.

Furthermore, the receiving assembly further comprises a second collimating lens for collimating the laser, where the second collimating lens is arranged adjacent to the optical fiber and the optical fiber transmits the laser to the second collimating lens. The laser is collimated by the second collimating lens and is transmitted to the third inclined mirror.

Furthermore, the receiving assembly further comprises a third focusing lens for focusing the laser, where the third focusing lens is arranged between the third inclined mirror and the receiving chip; the third inclined mirror total reflects the laser and focuses the laser on the third focusing lens, and the laser is focused by the third focusing lens and is transmitted to the receiving chip.

Furthermore, the receiving assembly further comprises a third collimating lens for collimating the laser, where the third collimating lens is arranged between the third focusing lens and the receiving chip. The laser is focused by the third collimating lens and is transmitted to the third collimating lens, and the laser is collimated by the third collimating lens and is transmitted to the receiving chip.

The benefit effects of the present disclosure are: different from the prior art, the present disclosure provides the SR4 device for monitoring emission power and a monitoring method thereof, the laser is emitted, and the laser is reflected by the second inclined mirror. The laser is focused and emitted to the monitoring chip, and the monitoring chip directly monitors the emission power through receiving reflected signal, which is without device processing and surface coating process. The present disclosure use a plurality of collimating lens and focusing lens to make the laser successfully transmit in the SR4 device.

BRIEF DESCRIPTION OF THE DRAWINGS

The present disclosure will be further described with reference to the accompanying drawings and embodiments.

DETAILED DESCRIPTION

The following will clearly and completely describe the technical solutions in the embodiments of the present disclosure with reference to the accompanying drawings in the embodiments of the present disclosure.

Figure 1:
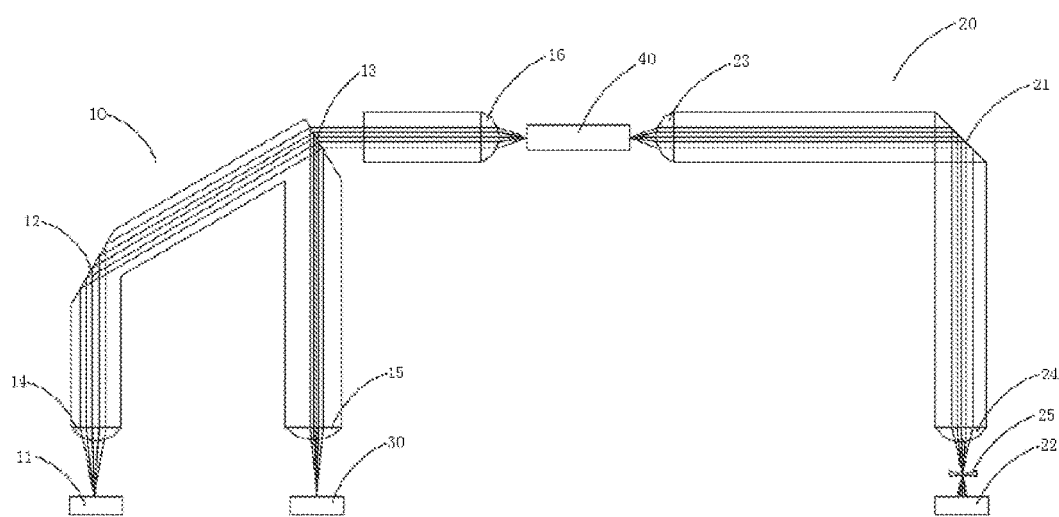
FIG. 1 is a schematic diagram of a 4-channel parallel-optical (SR4) device of the present disclosure.
Figure 2:
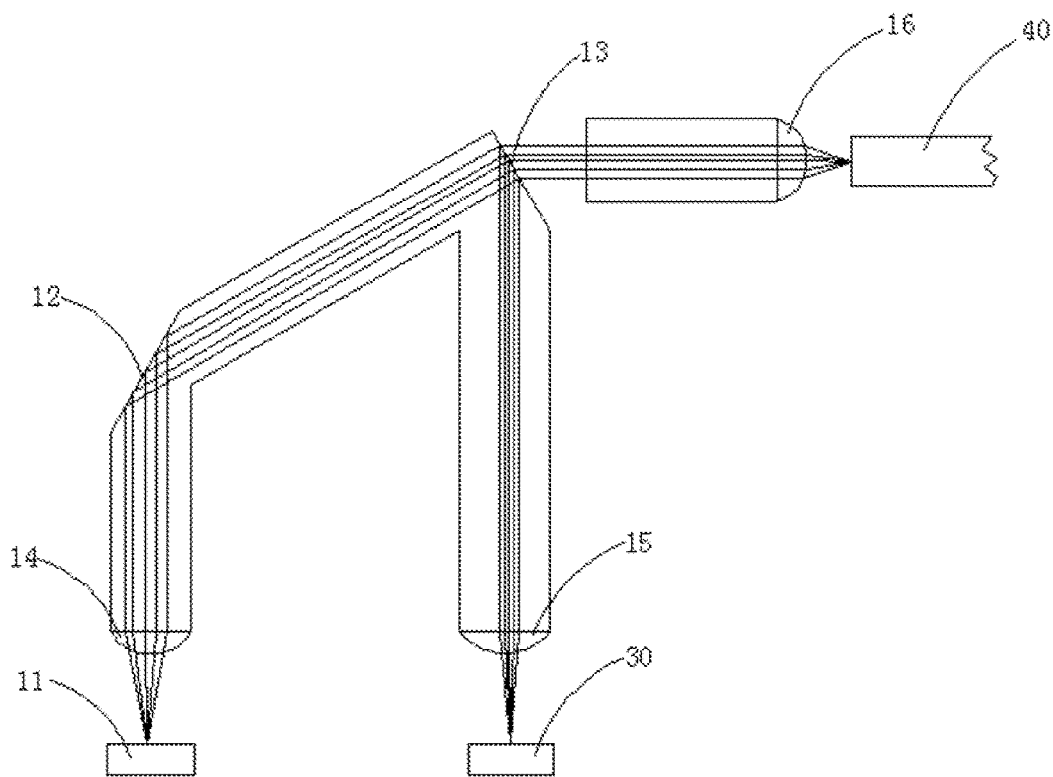
FIG. 2 is a schematic diagram of an emission assembly of the present disclosure.
Figure 3:
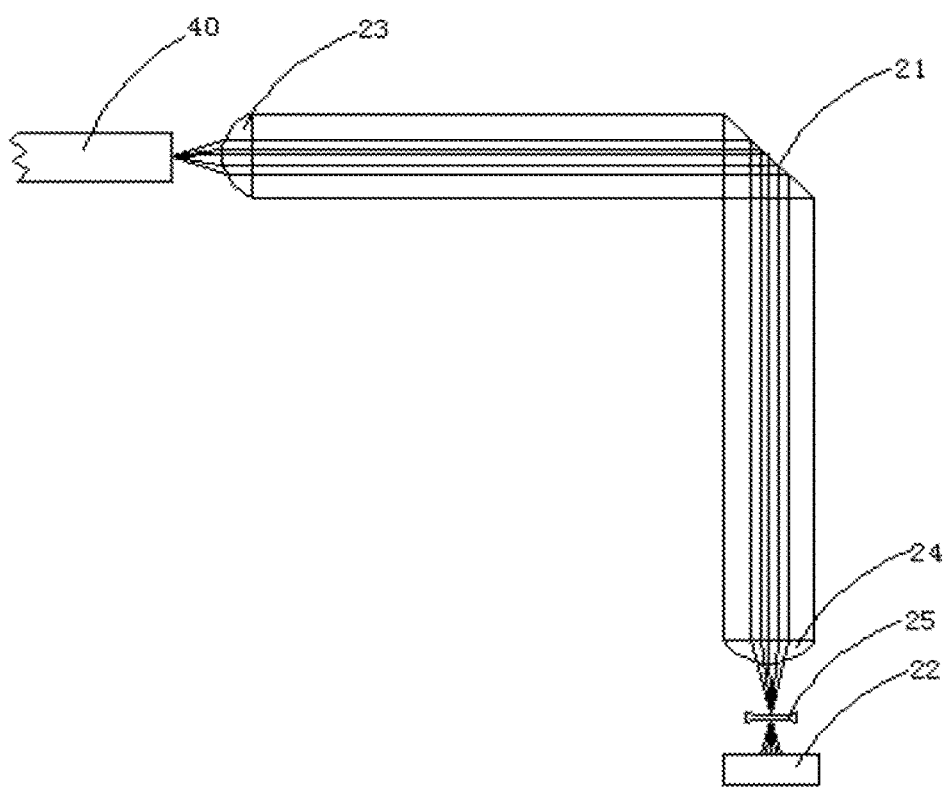
FIG. 3 is a schematic diagram of a receiving assembly of the present disclosure.

As shown in FIG. 1 to FIG. 3, the present disclosure provides an embodiment of a 4-channel parallel-optical (SR4) device for monitoring an emission power.

To be specific, as shown in FIG. 1, the SR4 device for monitoring an emission power comprises an emission assembly 10 for emitting laser, a receiving assembly 20 for receiving the laser, and a monitoring assembly 30 for monitoring the emission power of the emission assembly 10, where the monitoring assembly 30 is a monitoring chip. The emission assembly 10 is used to emit the laser to the receiving assembly 20, the receiving assembly 20 receives the laser, and the monitoring assembly 30 monitors a power of the emitted laser of the emission assembly 10 in real-time.

As shown in FIG. 2, the emission assembly 10 comprises an emission chip 11, a first inclined mirror 12 for total reflecting the laser, a second inclined mirror 13 for refracting and reflecting the laser, a first collimating lens 14 for collimating the laser, a first focusing lens 16 for focusing the laser, and a second focusing lens 15 for focusing the laser. The first collimating lens 14 is arranged adjacent to the emission chip 11. Along with transmitting direction of the laser, the first inclined mirror 12 is arranged behind the first collimating lens 14, the second inclined mirror 13 is arranged behind the first inclined mirror 12, the first focusing laser 15 is arranged between the second inclined mirror 13 and the monitoring assembly 30, and the first focusing laser 15 is arranged adjacent to an optical fiber. The first inclined mirror 12 is a planar reflector, to make the laser total reflect. The first inclined mirror 12 is set to a predetermined angle to make the emitted laser of the emission chip 11 total reflect. An inner angle of the first inclined mirror 12 is matched with the inner angle of the second inclined mirror 13, so that the laser is horizontally transmitted towards the optical fiber and an optical path can be coupled.

As shown in FIG. 3, the receiving assembly 20 comprises a third inclined mirror 21 for total reflecting and focusing the laser, a receiving chip 22, a second collimating lens 23 for collimating the laser, a third focusing lens 24 for focusing the laser, and a third collimating lens 25 for collimating the laser. The second collimating lens 23 is arranged adjacent to the optical fiber 40. Along with transmitting direction of the laser, the third inclined mirror 21 is arranged behind the second collimating lens 23, the third focusing lens 24 is arranged between the third inclined mirror 21 and the receiving chip 22, and the third focusing lens 24 is arranged behind the third inclined mirror 21. The third collimating lens 25 is arranged between the third focusing lens 24 and the receiving chip 22, and the third collimating lens 25 is arranged behind the third focusing lens 24. The third inclined mirror 21 is a spherical reflector to reflect and focus the laser, the laser is focused and is transmitted to the third focusing lens 24, which avoids the laser overflowing through-aperture.

The transmission of the optical path of the emission assembly 10 is as follow: the transmission chip 11 emits the laser to the first collimating lens 14, the laser is collimated by the first collimating lens 14 and is transmitted to the first inclined mirror 12, the first inclined mirror 12 total reflects the laser to the second inclined mirror 13 and a part of the laser is refracted by the second inclined mirror 13 and is horizontally transmitted to the first focusing lens 16. The laser is focused by the first focusing lens 16 and is transmitted to the optical fiber 40. The second inclined mirror 13 reflects a part of the laser to the second focusing lens 15. The laser is focused by the second focusing lens 15 and is transmitted to the monitoring assembly 30. The monitoring assembly 30 receives the reflected laser and monitors power parameters of the reflected laser.

The transmission of the optical path of the receiving assembly 20 is as follow: the laser is emitted to the second collimating lens 23 through the optical fiber 40, and the laser is collimated by the second collimating lens 23 and emits to the third inclined mirror 21: the third inclined mirror 21 total reflects and focuses the laser, which avoids the laser overflowing through-aperture. Along with the transmission of the optical path, the laser is transmitted to the third focusing lens 24, the laser is focused by the third focusing lens 24 and is emitted to the third collimating lens 25, the laser is collimated by the third collimating lens 25 and the laser is transmitted to the receiving chip 22. The receiving chip 22 receives the laser.

In the embodiment, an angle between the first inclined mirror 12 and the laser is 150°, and the laser is emitted to a surface of the first inclined mirror 12. An angle between the second inclined mirror 13 and the laser is 150°, and the laser is emitted to a surface of the second inclined mirror 13. An angle between the third inclined mirror and the laser is 135°, and the laser is emitted to a surface of the third inclined mirror. It should be understood, inclined angles of the first inclined mirror 12, the second inclined mirror 13, the third inclined mirror 21 depend on angle of the emitted laser, which is not limited.

Furthermore, the SR4 device is integrally formed as a whole.

Figure 4:
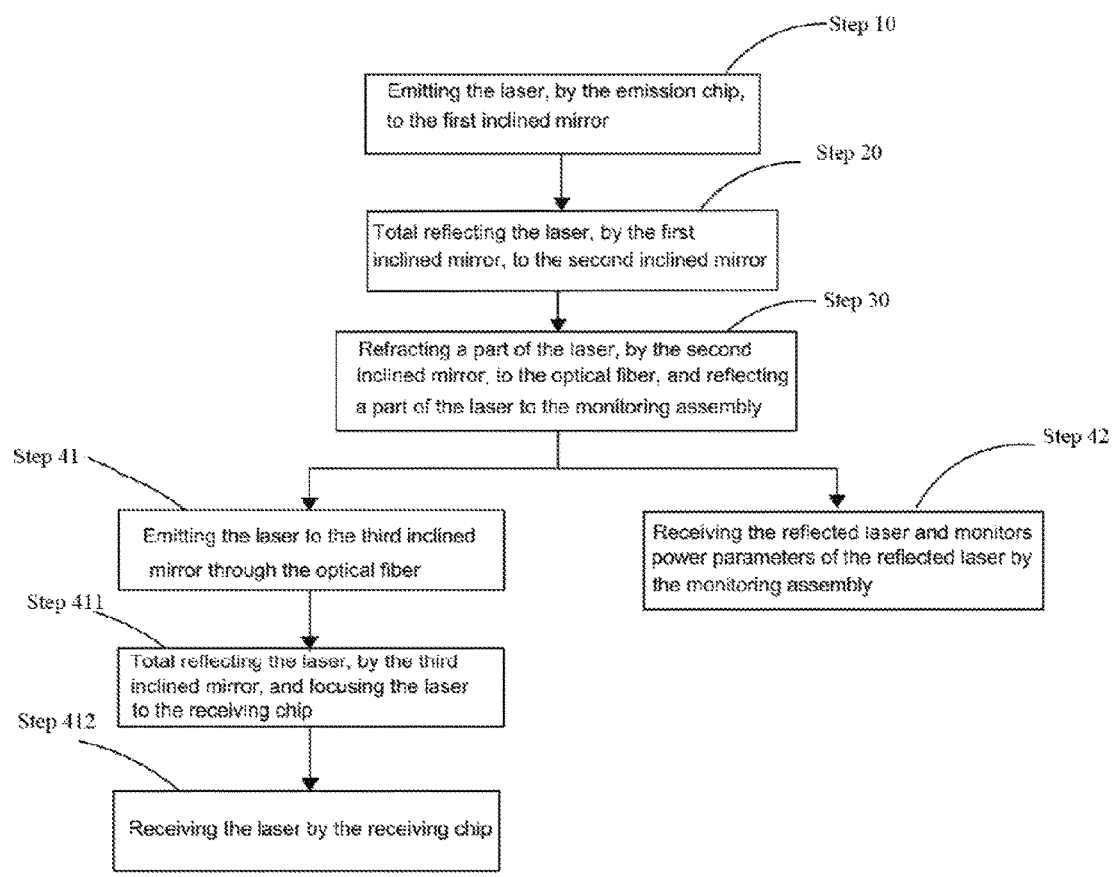
FIG. 4 is a flowchart diagram of a monitoring method of the present disclosure.

As shown in FIG. 4, the present disclosure further provides a preferred embodiment of a monitoring method.

To be specific, as shown in FIG. 4, the monitoring method applied on the SR4 device, the SR4 device comprises the emission assembly 10 for emitting the laser, the receiving assembly 20 for receiving the laser, and the monitoring assembly 30 for monitoring the emission power of the emission assembly 10; the emission assembly 10 comprises the emission chip 11, the first inclined mirror 12 for total reflecting the laser, and the second inclined mirror 13 for refracting and reflecting the laser; the receiving assembly 20 comprises the third inclined mirror 21 for total reflecting and focusing the laser and the receiving chip 22; the inner angle of the first inclined mirror 12 is matched with the inner angle of the second inclined mirror 13 to horizontally transmit the laser towards the optical fiber; the monitoring method comprising:

Step10: emitting the laser, by the emission chip, to the first inclined mirror:

Step20: total reflecting the laser, by the first inclined mirror, to the second inclined mirror;

Step30: refracting a part of the laser, by the second inclined mirror, to the optical fiber, and reflecting a part of the laser to the monitoring assembly;

Step41: emitting the laser to the third inclined mirror through the optical fiber;

Step42: receiving the reflected laser and monitors power parameters of the reflected laser by the monitoring assembly;

Step411: total reflecting the laser, by the third inclined mirror, and focusing the laser to the receiving chip;

Step412: receiving the laser by the receiving chip.

Furthermore, the first inclined mirror 12 is a planar reflector and the third inclined mirror 21 is a spherical reflector. An angle between the first inclined mirror 12 and the laser is 150°, and the laser is emitted to a surface of the first inclined mirror 12. An angle between the second inclined mirror 13 and the laser is 150°, and the laser is emitted to a surface of the third inclined mirror 13. An angle between the third inclined mirror 21 and the laser is 135°, and the laser is emitted to a surface of the third inclined mirror 21. The emission assembly 10 further comprises a first collimating lens 14 for collimating the laser, where the first collimating lens 14 is arranged adjacent to the emission chip 11. The emission chip 11 emits the laser to the first collimating lens 14, and the laser is collimated by the first collimating lens 14 and is transmitted to the first inclined mirror 12.

The emission assembly further comprises a first focusing lens for focusing the laser, where the first focusing lens is arranged adjacent to the optical fiber. The second inclined mirror refracts a part of the laser to the first focusing lens, and the laser is focused by the first focusing lens and is transmitted to the optical fiber. The emission assembly further comprises a second focusing lens for focusing the laser, where the second focusing lens is arranged adjacent to the monitoring assembly. The second focusing lens reflects a part of the laser to the second focusing lens, and the laser is focused by the second focusing lens and is transmitted to the monitoring assembly.

The receiving assembly further comprises a second collimating lens for collimating the laser, where the second collimating lens is arranged adjacent to the optical fiber and the optical fiber transmits the laser to the second collimating lens. The laser is collimated by the second collimating lens and is transmitted to the third inclined mirror. The receiving assembly further comprises a third focusing lens for focusing the laser, where the third focusing lens is arranged between the third inclined mirror and the receiving chip; the third inclined mirror total reflects the laser and focuses the laser on the third focusing lens, and the laser is focused by the third focusing lens and is transmitted to the receiving chip. The receiving assembly further comprises a third collimating lens for collimating the laser, where the third collimating lens is arranged between the third focusing lens and the receiving chip. The laser is focused by the third collimating lens and is transmitted to the third collimating lens, and the laser is collimated by the third collimating lens and is transmitted to the receiving chip The foregoing descriptions are merely implementation manners of the present disclosure, and therefore do not limit the scope of patents of the present disclosure. Any equivalent structure or equivalent process transformation using the description of the present disclosure and the accompanying drawings may be directly or indirectly applied to other related technologies. The same applies in the field of patent protection of this disclosure.

What is claimed is:

1. A 4-channel parallel-optical (SR4) device for monitoring an emission power, comprising:
    an emission assembly for emitting laser,
    a receiving assembly for receiving the laser, and
    a monitoring assembly for monitoring the emission power of the emission assembly,
    wherein the emission assembly comprises an emission chip, a first inclined mirror for total reflecting the laser, and a second inclined mirror for refracting and reflecting the laser; the receiving assembly comprises a third inclined mirror or total reflecting and focusing the laser an inner angle of the first inclined mirror is matched with an inner angle of the second inclined mirror to horizontally transmit the laser towards the optical fiber;
    wherein the emission chip emits the laser to the first inclined mirror, the first inclined mirror total reflects the laser to the second inclined mirror, and the second inclined mirror refracts a part of the laser to the optical fiber and reflects a part of the laser to the monitoring assembly; the monitoring assembly receives the reflected laser and monitors power parameters of the reflected laser; the laser is emitted to the third inclined mirror through the optical fiber, the third inclined mirror total reflects the laser and focus the laser to the receiving chip, and the receiving chip receives the laser.

2. The SR4 device according to claim 1, wherein the first inclined mirror is a planar reflector; the third inclined mirror is a spherical reflector.

3. The SR4 device according to claim 2, wherein an angle between the first inclined mirror and the laser is 150°, and the laser is emitted to a surface of the first inclined mirror; an angle between the second inclined mirror and the laser is 150°, and the laser is emitted to a surface of the third inclined mirror; an angle between the third inclined mirror and the laser is 135°, and the laser is emitted to a surface of the third inclined mirror.

4. The SR4 device according to claim 1, wherein the emission assembly further comprises a first collimating lens for collimating the laser; the first collimating lens is arranged adjacent to the emission chip; the emission chip emits the laser to the first collimating lens, the laser is collimated by the first collimating lens and is transmitted to the first inclined mirror.

5. The SR4 device according to claim 4, wherein the emission assembly further comprises a first focusing lens for focusing the laser; the first focusing lens is arranged adjacent to the optical fiber; the second inclined mirror refracts a part of the laser to the first focusing lens; the laser is focused by the first focusing lens and is transmitted to the optical fiber.

6. The SR4 device according to claim 5, wherein the emission assembly further comprises a second focusing lens for focusing the laser; the second focusing lens is arranged adjacent to the monitoring assembly; the second focusing lens reflects a part of the laser to the second focusing lens, and the laser is focused by the second focusing lens and is transmitted to the monitoring assembly.

7. The SR4 device according to claim 1, wherein the receiving assembly further comprises a second collimating lens for collimating the laser; the second collimating lens is arranged adjacent to the optical fiber and the optical fiber transmits the laser to the second collimating lens; the laser is collimated by the second collimating lens and is transmitted to the third inclined mirror.

8. The SR4 device according to claim 7, wherein the receiving assembly further comprises a third focusing lens for focusing the laser; the third focusing lens is arranged between the third inclined mirror and the receiving chip; the third inclined mirror total reflects the laser and focuses the laser on the third focusing lens, and the laser is focused by the third focusing lens and is transmitted to the receiving chip.

9. The SR4 device according to claim 8, wherein the receiving assembly further comprises a third collimating lens for collimating the laser; the third collimating lens is arranged between the third focusing lens and the receiving chip; the laser is focused by the third collimating lens and is transmitted to the third collimating lens, and the laser is collimated by the third collimating lens and is transmitted to the receiving chip.

10. A monitoring method applied on a 4-channel parallel-optical (SR4) device, the SR4 comprises an emission assembly for emitting laser, a receiving assembly for receiving the laser, and a monitoring assembly for monitoring the emission power of the emission assembly; the emission assembly comprises an emission chip, a first inclined mirror for total reflecting the laser, and a second inclined mirror for refracting and reflecting the laser; the receiving assembly comprises a third inclined mirror for total reflecting and focusing the laser; an inner angle of the first inclined mirror is matched with an inner angle of the second inclined mirror to horizontally transmit the laser towards the optical fiber; the monitoring method, comprising:
    emitting laser, by the emission chip, to the first inclined mirror;
    total reflecting the laser, by the first inclined mirror, to the second inclined mirror;
    refracting a part of the laser, by the second inclined mirror, to the optical fiber, and reflecting a part of the laser to the monitoring assembly;
    emitting the laser to the third inclined mirror through the optical fiber;
    receiving the reflected laser and monitors power parameters of the reflected laser by the monitoring assembly;
    total reflecting the laser, by the third inclined mirror, and focusing the laser to the receiving chip; and
    receiving the laser by the receiving chip.

11. The monitoring method according to claim 10, wherein the first inclined mirror is a planar reflector; the third inclined mirror is a spherical reflector.

12. The monitoring method according to claim 11, wherein an angle between the first inclined mirror and the laser is 150°, and the laser is emitted to a surface of the first inclined mirror; an angle between the second inclined mirror and the laser is 150°, and the laser is emitted to a surface of the third inclined mirror; an angle between the third inclined mirror and the laser is 135°, and the laser is emitted to a surface of the third inclined mirror.

13. The monitoring method according to claim 10, wherein the emission assembly further comprises a first collimating lens for collimating the laser the first collimating lens is arranged adjacent to the emission chip; the emission chip emits the laser to the first collimating lens, the laser is collimated by the first collimating lens and is transmitted to the first inclined mirror.

14. The monitoring method according to claim 13, wherein the emission assembly further comprises a first focusing lens for focusing the laser; the first focusing lens is arranged adjacent to the optical fiber; the second inclined mirror refracts a part of the laser to the first focusing lens; the laser is focused by the first focusing lens and is transmitted to the optical fiber.

15. The monitoring method according to claim 14, wherein the emission assembly further comprises a second focusing lens for focusing the laser, the second focusing lens is arranged adjacent to the monitoring assembly; the second focusing lens reflects a part of the laser to the second focusing lens, and the laser is focused by the second focusing lens and is transmitted to the monitoring assembly.

16. The monitoring method according to claim 10, wherein the receiving assembly further comprises a second collimating lens for collimating the laser; the second collimating lens is arranged adjacent to the optical fiber and the optical fiber transmits the laser to the second collimating lens: the laser is collimated by the second collimating lens and is transmitted to the third inclined mirror.

17. The monitoring method according to claim 16, wherein the receiving assembly further comprises a third focusing lens for focusing the laser; the third focusing lens is arranged between the third inclined mirror and the receiving chip; the third inclined mirror total reflects the laser and focuses the laser on the third focusing lens, and the laser is focused by the third focusing lens and is transmitted to the receiving chip.

18. The monitoring method according to claim 17, wherein the receiving assembly further comprises a third collimating lens for collimating the laser; the third collimating lens is arranged between the third focusing lens and the receiving chip; the laser is focused by the third collimating lens and is transmitted to the third collimating lens, and the laser is collimated by the third collimating lens and is transmitted to the receiving chip.

* * * * *